United States Patent
Hara et al.

(10) Patent No.: US 6,861,316 B2
(45) Date of Patent: Mar. 1, 2005

(54) SEMICONDUCTOR DEVICE AND METHOD FOR FABRICATING THE SAME

(75) Inventors: Yoshihiro Hara, Osaka (JP); Akira Asai, Osaka (JP); Gaku Sugahara, Nara (JP); Haruyuki Sorada, Osaka (JP); Teruhito Ohnishi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/637,212

(22) Filed: Aug. 8, 2003

(65) Prior Publication Data

US 2004/0029355 A1 Feb. 12, 2004

Related U.S. Application Data

(63) Continuation of application No. PCT/JP03/00141, filed on Jan. 9, 2003.

(30) Foreign Application Priority Data

Jan. 9, 2002 (JP) ........................................ 2002-002033

(51) Int. Cl.$^7$ .................... H01L 21/336; H01L 21/8234
(52) U.S. Cl. ........................ 438/285; 438/198; 438/933
(58) Field of Search ................................ 438/285, 185, 438/933, 198, 163, 172, 161

(56) References Cited

U.S. PATENT DOCUMENTS

| | | | |
|---|---|---|---|
| 5,266,813 A | * 11/1993 | Comfort et al. | 257/19 |
| 5,272,365 A | 12/1993 | Nakagawa | |
| 5,461,243 A | * 10/1995 | Ek et al. | 257/190 |
| 6,118,151 A | * 9/2000 | Tsutsu | 257/347 |
| 6,191,432 B1 | 2/2001 | Sugiyama et al. | |
| 6,350,993 B1 | * 2/2002 | Chu et al. | 257/19 |
| 6,372,593 B1 | * 4/2002 | Hattori et al. | 438/311 |
| 6,429,061 B1 | * 8/2002 | Rim | 438/198 |
| 6,461,945 B1 | * 10/2002 | Yu | 438/163 |
| 6,723,541 B2 | * 4/2004 | Sugii et al. | 438/198 |

FOREIGN PATENT DOCUMENTS

| | | |
|---|---|---|
| JP | 03280437 A | 12/1991 |
| JP | 2001-267413 A | 9/2001 |
| WO | WO 00/16391 | 3/2000 |

OTHER PUBLICATIONS

Written Opinion for Application No. PCT/JP03/00141; Mailed Sep. 2, 2003.
International Preliminary Examination Report for Application No. PCT/JP03/00141; Mailed Feb. 17, 2004.
"Handotai Process Handbook"; Kabushiki Kaisha Puresu Janaru, Koji Shinohara; Oct. 15, 1996 pp. 131–132.
English Translation of International Search Report for PCT/JP03/00141; Date of Mailing Apr. 30, 2003; ISA Japanese Patent Office.
International Search Report—PCT/JP03/00141; ISA/JPO, date completed: Apr. 15, 2003.

\* cited by examiner

*Primary Examiner*—John F. Niebling
*Assistant Examiner*—Walter L. Lindsay, Jr.
(74) *Attorney, Agent, or Firm*—Harness, Dickey & Pierce, P.L.C.

(57) ABSTRACT

On an Si substrate 1, a buffer layer 2, a SiGe layer 3, and an Si cap layer 4 are formed. A mask is formed on the substrate, and then the substrate is patterned. In this manner, a trench 7a is formed so as to reach the Si substrate 1 and have the side faces of the SiGe layer 3 exposed. Then, the surface of the trench 7a is subjected to heat treatment for one hour at 750° C. so that Ge contained in a surface portion of the SiGe layer 3 is evaporated. Thus, a Ge evaporated portion 8 having a lower Ge content than that of other part of the SiGe layer 3 is formed in part of the SiGe layer 3 exposed at part of the trench 7a. Thereafter, the walls of the trench 7a are oxidized.

8 Claims, 15 Drawing Sheets

SEMICONDUCTOR DEVICE AND METHOD FOR FABRICATING THE SAME

CROSS-REFERENCE TO RELATED APPLICATION

This is a continuation of International Patent Application PCT/JP03/00141, filed Jan. 9, 2003.

BACKGROUND OF THE INVENTION

The present invention relates to a semiconductor device including a layer which contains Si and Ge and a method for fabricating the same, and more particularly relates to a semiconductor device which includes a SiGe layer or a SiGeC layer and is isolated from adjacent semiconductor devices by trench isolation and a method for fabricating the same.

In recent years, research and development has been actively carried out on heterojunction field effect transistors, heterojunction bipolar transistors, and like devices using an $Si_{1-x}Ge_x$ (0<x<1) layer (which will be herein referred to as an "SiGe layer") of a mixed crystal of silicon (Si) and germanium (Ge).

As for heterojunction devices using a SiGe layer, with increased carrier mobility in the SiGe layer, high speed operation can be achieved. In addition, process steps for fabricating devices using a SiGe layer (which will be herein referred to as "SiGe devices") can be used interchangeably with those for fabricating devices using an Si layer (which will be herein referred to as "Si devices"). Thus, fabrication techniques and production lines for use in fabricating Si devices can be used in most of the process steps for fabricating SiGe devices. Therefore, it is also possible to integrate SiGe devices on an Si substrate. As can be seen from the above, SiGe devices exhibit excellent properties in terms of performance and cost.

When a large number of SiGe devices are integrated on an Si substrate, isolation techniques for electrically insulating one device from another are critical as in the case of integrating known Si devices.

As known isolation techniques, local oxidation of silicon (LOCOS) and trench isolation techniques have been used. When a LOCOS technique is used, however, there may be cases in which so-called birds' beaks are formed so that an oxide film for isolating devices from each other enters into a transistor forming region. In such a case, the area of the transistor forming region is reduced, and therefore it is difficult to avoid this situation and to achieve reduction in the size of integrated circuits at the same time. Thus, trench isolation techniques which can isolate one device from another without causing reduction in the area of the transistor forming region are the mainstream isolation techniques for integrated circuits in accordance with the recent rules for size reduction.

Hereinafter, isolation techniques for isolating devices including a SiGe layer will be described. In Japanese Unexamined Patent Publication No. 10-321733 (U.S. Pat. No. 6,111,267), using a LOCOS technique, devices including a SiGe layer are isolated from each other. However, for the reason described above, trench isolation techniques are now expected to be the mainstream isolation techniques for isolating SiGe devices, as in the case of isolating Si devices. Trench isolation techniques for forming a trench isolation can be roughly divided into two types. One is the type in which a trench is formed before a SiGe layer is formed. The other is the type in which a trench is formed after a SiGe layer has been formed.

Hereinafter, a method for fabricating a semiconductor device in which a trench isolation is formed before forming a SiGe layer on a substrate will be first described. In this method, the process step of forming a trench isolation is performed before the process step of forming a SiGe layer, and thus process steps of a known method for fabricating an Si device can be used. This method, however, may cause some inconveniences. For example, assume that a SiGe layer is epitaxially grown on a substrate in which a trench isolation has been formed. If the SiGe layer has been non-selectively grown, a polycrystalline SiGe layer may be formed on an oxide film and/or a polycrystalline silicon film, resulting in the generation of leakage current. If the SiGe layer is selectively grown, facets may be created in the peripheral portion (boundary portion) of part of the substrate in which the SiGe layer is selectively grown, thus resulting in fluctuation of the threshold voltage of a device.

Next, a method for fabricating a semiconductor device in which a trench isolation is formed after a SiGe layer has been formed on a substrate will be hereinafter described with reference to FIGS. 10A through 10E. FIGS. 10A through 10E are cross-sectional views illustrating respective process steps for forming a trench isolation in a substrate on which a SiGe layer has been formed in a known fabrication method. Note that in the process steps shown in FIGS. 10A through 10E, a trench isolation is formed by the same process steps as those for forming a trench isolation in a known Si device.

First, in the process step shown in FIG. 10A, an Si buffer layer 102 having a thickness of 10 nm, a SiGe layer 103 having a 25% Ge content and a thickness of 15 nm and, an Si cap layer 104 having a thickness of 15 nm are epitaxially grown by UHV-CVD on an Si substrate 101 containing an n-type impurity at a concentration of $1\times10^{18}$ cm$^{-3}$. In the UHV-CVD, $Si_2H_6$ (disilane) and $GeH_4$ (germane) are used as source gasses of Si and Ge, respectively. The growth temperature is 550° C. and no intentional doping is performed. Note that the semiconductor substrate is divided into an active layer forming region Rac and an isolation region Rre for convenience of description.

Next, in the process step shown in FIG. 10B, a silicon thermal oxide film 105 is formed by thermally oxidizing an upper portion of the Si cap layer 104. With this thermal oxidation, the upper portion of the Si cap layer 104 is oxidized to be a thermal oxide film, and therefore the thickness of the Si cap layer 104 becomes about 8 nm. Note that the thermal oxidation temperature is 750° C. Thereafter, a silicon nitride film 106 having a thickness of 210 nm is formed on the silicon thermal oxidation film 105. Note that the deposition temperature for the silicon nitride film 106 is 740° C. In this case, when each of the silicon thermal oxide film 105 and the silicon nitride film 106 is formed at a lower temperature, it is possible to prevent defects from generating due to relaxation of the strained SiGe layer 103 formed on an Si crystalline layer.

Then, parts of the silicon nitride film 106 and the silicon thermal oxide film 105 located in the isolation region Rre are removed by anisotropic dry etching. Subsequently, the Si cap layer 104, the SiGe layer 103, the Si buffer layer 102 and an upper portion of the Si substrate 101 are patterned using as a mask remaining parts of the silicon nitride film 106 and the silicon thermal oxide film 105 located in the active layer forming region Rac. In this manner, a trench 107a is formed so as to have a depth of about 0.4 ì m to 0.8 ì m and reach to the Si substrate 101. In this case, the side faces of the SiGe layer 103 are exposed at the side surfaces of the trench 107a by forming the trench 107a.

Next, in the process step shown in FIG. 10C, the surface of the trench 107a is thermally oxidized at 750° C., thereby forming a trench surface coating film 108 so as to coat the surface of the trench 107a.

Next, in the process step shown in FIG. 10D, an oxide film is formed on the substrate, and then part of the oxide film located in the active layer forming region Rac is removed by etch-back or CMP (chemical mechanical polish). In this manner, a trench oxide film 109 is formed so as to fill the trench 107a. Thus, active regions are isolated from each other by a trench isolation 107 including the trench oxide film 109 and the trench surface coating film 108.

Next, in the process step shown in FIG. 10E, remaining parts of the silicon nitride film 106 and the silicon thermal oxide film 105 located in the active layer forming region Rac in the substrate are removed by etching, so that part of the Si cap layer 104 located in the active layer forming region Rac is exposed.

In connection with the fabrication of a semiconductor device including a layer containing Si and Ge, a process step for forming an oxide film by thermally oxidizing a surface portion of a trench in the above-described manner is disclosed in Japanese Unexamined Patent Publication No. 10-74943 (U.S. Pat. No. 6,191,432). Furthermore, in the publication, disclosed is a semiconductor device fabrication method in which an Si layer having a thickness of about 5 nm to 50 nm is formed in a surface portion of a trench and then the Si layer is oxidized. This method is also disclosed in Japanese Examined Patent Publication No. 6-80725 (U.S. Pat. No. 5,266,813 and U.S. Pat. No. 5,308,785).

Now, a semiconductor device including a trench isolation formed in the process steps shown in FIGS. 10A through 10E, i.e., a p-type MOSFET in which a SiGe layer serves as a hole channel (SiGe p-MOSFET) will be described with reference to FIGS. 11A and 11B. FIGS. 11A and 11B are cross-sectional and plane views illustrating the structure of the p-type MOSFET including a trench isolation formed in a known manner. FIG. 1A is a cross-sectional view taken along the line XI—XI shown in FIG. 11B.

An Si buffer layer 102, a SiGe layer 103, and an Si cap layer 104 are formed on part of an Si substrate 101 located in an active layer forming region Rac. On the Si cap layer 104, a gate electrode 111 is formed with a gate insulating film 110 interposed between the Si cap layer 104 and the gate electrode 111. Source/drain regions 112 heavily doped with p-type ions are provided in parts of the Si cap layer 104, the SiGe layer 103, the Si buffer layer 102, and the Si substrate 101 located on both sides of the gate electrode 111 so as to be spaced apart from each other. Then, parts of the Si cap layer 104, the SiGe layer 103, the Si buffer layer 102, and the Si substrate 101 located under the gate electrode 111, i.e., parts of the layers located between the source/drain regions 112, serve as a channel region.

In an isolation region Rre of the Si substrate 101, a trench isolation 107 including a trench oxide film 109 and a trench surface coating film 108 coating the trench oxide film 109 is formed. With the trench isolation 107, parts of the active layer forming region Rac which are to be active regions are isolated from each other.

On the Si cap layer 104 and the trench isolation 107, an interlevel insulating film 114 is formed so as to cover the gate electrode 111. Then, an interconnect 115 of, e.g., Al is formed so as to reach the source/drain region 112 through the interlevel insulating film 114 and an $SiO_2$ film. A known p-MOSFET including a trench isolation has the above-described structure.

As for the SiGe p-MOSFET of FIGS. 11A and 11B, however, when a trench isolation is formed in the known process steps described in FIGS. 10A through 10E, the following inconveniences occur.

In the process step shown in FIG. 10C, thermal oxidation is performed with the side faces of the SiGe layer 103 being exposed at the side surfaces of the trench 107a. Thus, the trench surface coating film 108 is formed. As the thermal oxidation process proceeds, Si is oxidized in the side faces of the SiGe layer 103 exposed at the side surfaces of the trench 107a and also in part of the SiGe layer 103 located close to the exposed side faces. Thus, the part of the SiGe layer 103 in which Si has been oxidized becomes parts of the trench surface coating film 108 formed of $SiO_2$, and Ge is expelled from the trench surface coating film 108. As a result, when the thermal oxidation process is finished, Ge segregates at the interface between the trench surface coating film 108 and part of the SiGe layer 103 which has not been oxidized, thereby forming a layer containing Ge at a high concentration. Also, there have been reported cases in which depending on conditions for thermal oxidation, regions containing a high concentration of Ge are formed and distributed like islands in the trench surface coating film 108. Moreover, Ge segregates in edge portions of the channel region located under the gate electrode and at the interface between the active layer forming region Rac and the isolation region Rre, resulting in a Ge segregation layer 116, as shown in FIG. 11B.

Naturally, more interface states are generated at the interface between an $SiO_2$ layer and a SiGe layer than at the interface between an $SiO_2$ layer and an Si layer. If many interface states are generated, threshold voltage in a device may fluctuate. Interface states may also form a channel for leakage current flowing between the source and the drain in a transistor or between different transistors.

The existence of part of the substrate which contain Ge at a high concentration between the trench surface coating film 108 and the SiGe layer 103 may also cause fluctuation in threshold voltage.

FIG. 12 is a graph showing drain current-gate voltage characteristics in the SiGe p-MOSFET shown in FIGS. 11A and 11B. The data shown in the graph of FIG. 12 was obtained by measurements under the conditions in which both of the gate length and the gate width were 50 ì m and a source-drain voltage of −300 mV was applied. The graph shows that transistor properties have been degenerated due to the above-described inconveniences, such as an increase in leakage current and fluctuation in threshold voltage.

Ge segregation in performing thermal oxidation occurs not only in the process step of forming a trench but also in the process step of forming a gate oxide film on the SiGe layer. Then, in such a case, a gate oxide film has to be formed by oxidizing an Si cap layer with the SiGe layer covered by the Si cap layer.

Moreover, when an $Si_{1-x-y}Ge_xC_y$ (0<x<1, 0≦y<1) layer (which will be herein referred to as "a SiGeC layer") is thermally oxidized, Ge segregation also occurs.

SUMMARY OF THE INVENTION

An object of the present invention is to devise means for suppressing the occurrence of Ge segregation when a SiGe layer or a SiGeC layer is thermally oxidized and thereby to provide a semiconductor device in which leakage current can be suppressed and the threshold voltage hardly fluctuates and a method for fabricating the same.

A method for fabricating a semiconductor device according to the present invention includes the steps of: a) forming a compound semiconductor layer containing Si and Ge above a semiconductor substrate; b) removing part of the compound semiconductor layer to form a trench; c) performing heat treatment on a surface portion of the trench; d) oxidizing at least part of the surface portion of the trench to form a thermal oxide film; and e) filling the trench with an insulator to form a trench isolation including the thermal oxide film and the insulator.

With the inventive method, Ge contained in part of a compound semiconductor layer located at a surface portion of a trench can be evaporated by heat treatment. Also, oxidation is performed after the Ge content of the surface portion is reduced, and thus the amount of Ge segregation can be reduced. Accordingly, when a semiconductor device is in an operation state, the number of interface states to be generated at the interface between a formed oxide film and the compound semiconductor layer can be reduced. Therefore, it is possible to suppress leakage current and fluctuation of threshold voltage in the device.

In the step c), the heat treatment may be performed under vacuum. Thus, Ge can be evaporated more effectively.

In the step c), the heat treatment may be performed in a non-oxygen atmosphere. Thus, Ge can be evaporated without oxidation being progressed in the compound semiconductor layer. Also, costs can be reduced.

The inventive method may further include after the step a), the step of epitaxially growing an Si layer on the compound semiconductor layer. Thus, a strained Si layer can be formed, resulting in a semiconductor device with a high current drivability.

If the step a) is characterized in that the compound semiconductor device is formed on the semiconductor substrate with an insulating layer interposed between the semiconductor substrate and the compound semiconductor layer, a semiconductor device can be electrically isolated from adjacent devices with higher reliability.

The heat treatment may be performed at a temperature ranging from 700° C. to 1050° C. Thus, Ge can be evaporated without causing any inconvenience due to degradation of the compound semiconductor layer or the like.

In the step d), part of the compound semiconductor layer extending from the surface thereof located at the trench to a distance of 30 nm or less may be oxidized. Thus, a thermal oxide film can be formed of the oxidized part of the compound semiconductor layer which is not an active region.

In the step c), an upper portion of the compound semiconductor layer is subjected to heat treatment, in the step d), the upper portion of the compound semiconductor layer is oxidized to form a gate oxide film, and the method further includes after the step d), the step of forming a gate electrode on the gate oxide film. Thus, the amount of Ge segregation between the gate oxide film and the compound semiconductor layer can be reduced.

A semiconductor device according to the present invention includes: a semiconductor substrate; a compound semiconductor layer formed above the substrate and containing Si and Ge; an insulator; and a trench isolation including a thermal oxide film coating the insulator, wherein Ge is contained in part of the compound semiconductor layer which is in contact with the thermal oxide film at a lower concentration than that in another part of the compound semiconductor layer which is to be an active region.

In the semiconductor device, the amount of Ge segregation in the vicinity of the interface between the thermal oxide film and the compound semiconductor layer can be reduced. Accordingly, it is possible to suppress leakage current and fluctuation of threshold voltage of devices when the devices are in an operation state, because the generation of interface states is suppressed.

In part of the compound semiconductor layer which is in contact with the thermal oxide film, at least some of Ge atoms are preferably evaporated.

An epitaxially grown Si layer may be provided on the compound semiconductor layer. Thus, the Si layer is strained and thereby the current drivability of the device can be increased.

An insulating layer may be formed between the semiconductor substrate and the compound semiconductor layer. Thus, the semiconductor device can be electrically isolated from adjacent devices with reliability.

The thermal oxide film may have a thickness of 30 nm or less. Thus, a thermal oxide film can be formed of part of the compound semiconductor layer which is not an active region.

If a gate oxide film and a gate electrode are further provided on the compound semiconductor layer and the gate oxide film is formed by performing heat treatment on an upper portion of the compound semiconductor layer to evaporate Ge and then oxidizing at least part of the upper portion, the amount of Ge segregation at the interface between the gate oxide film and the compound semiconductor layer can be reduced.

DESCRIPTION OF THE PREFERRED EMBODIMENTS (First Embodiment)

In this embodiment, a method for fabricating a semiconductor device including a SiGe layer will be described with reference to FIGS. 1 through 6. Note that a semiconductor device including an Si layer and a SiGe layer (i.e., a strained SiGe layer) grown on the Si layer will be described as a semiconductor device including a SiGe layer.

First, process steps up to the process step of forming a trench isolation in a method for fabricating a semiconductor device will be described with reference to FIGS. 1A through 1C and FIGS. 2A through 2C. FIGS. 1A through 1C and FIGS. 2A through 2C are cross-sectional views illustrating respective process steps up to the process step of forming a trench isolation in the method for fabricating a p-MOSFET including a SiGe layer.

Figure 1A:
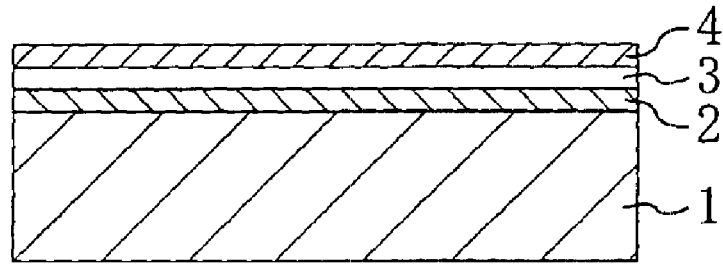
FIGS. 1A through 1C are cross-sectional views illustrating respective process steps up to the process step of performing heat treatment in a method for fabricating a p-MOSFET including a SiGe layer according to a first embodiment of the present invention.

In the process step shown in FIG. 1A, using UHV-CVD, an Si buffer layer 2 having a thickness of 10 nm, a SiGe layer 3 having a thickness of 15 nm and a 25% Ge content and, an Si cap layer 4 having a thickness of 15 nm are epitaxially grown on an Si substrate containing an n-type impurity at a concentration of $1 \times 10^{18}$ cm$^{-3}$. The UHV-CVD is performed using $Si_2H_6$ (disilane) and $GeH_4$ (germane) as source gasses of Si and Ge, respectively. The growth temperature is 550° C. and no intentional doping is performed. Note that the semiconductor substrate is divided into an active layer forming region Rac and an isolation region Rre for convenience of description.

Figure 1B:
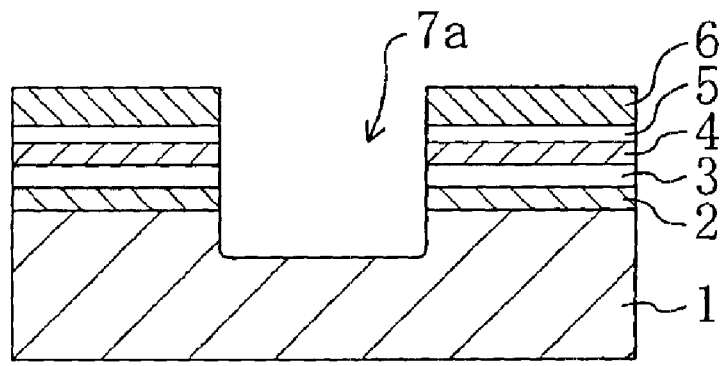

Next, as shown in FIG. 1B, an upper portion of the Si cap layer 4 is oxidized at a temperature of 750° C., thereby forming a silicon oxide film 5 having a thickness of 15 nm. In this case, the silicon oxide film 5 is formed by oxidizing part of the Si cap layer 4 and thus the thickness of the Si cap layer 4 itself is about 8 nm. Subsequently, a silicon nitride film 6 having a thickness of 210 nm is formed on the silicon oxide film 5 at a temperature of 740° C. In this case, when each of the silicon oxide film 5 and the silicon nitride film 6 is formed at a low temperature, it is possible to prevent defects from generating due to relaxation of the strained SiGe layer 3 formed on Si crystals.

Then, parts of silicon nitride film 6 and the silicon oxide film 5 located in the isolation region Rre are removed by anisotropic dry etching. Subsequently, the Si cap layer 4, the SiGe layer 3, the Si buffer layer 2 and an upper portion of the Si substrate 1 are patterned using as a mask remaining part of the silicon nitride film 6 located in the active layer forming region Rac. In this manner, a trench 7a is formed in part of the Si substrate 1 so as to have a depth of about 0.4 ì m to 0.8 ì m. In this case, side faces of the SiGe layer 3 are exposed at the side surfaces of the trench 7a by forming the trench 7a.

Figure 1C:
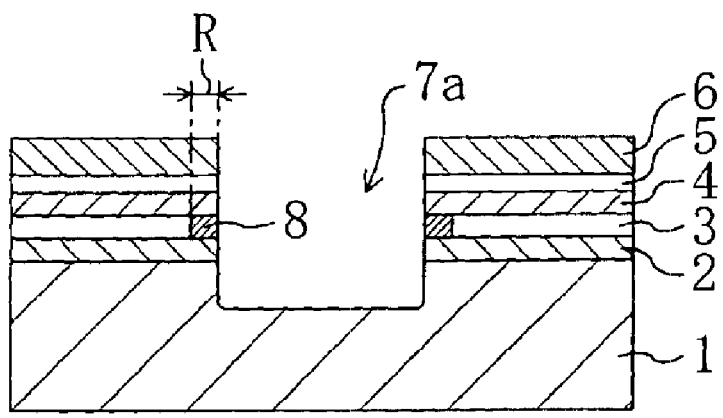

Next, in the process step shown in FIG. 1C, heat treatment is performed at 750° C. for 60 minutes under a vacuum of $2.66 \times 10^{-7}$ Pa. With the heat treatment, Ge is evaporated at part of a surface portion of the trench 7a at which the SiGe layer 3 is exposed. Herein, a surface portion of a trench means part of a substrate located in the vicinity of the surfaces of the trench but is not an active region of a device. With the Ge evaporation, a Ge evaporated portion 8 is formed in part of the SiGe layer 3 exposed to the trench 7a. The width R of the Ge evaporated portion 8 is preferably as small as a width that does not affect device operation. Specifically, when the width R is 30 nm or less, the Ge evaporated portion hardly affects device operation.

In the SiGe layer 3, the part other than the Ge evaporated portion 8 is the major portion having the same composition as that before the heat treatment. In the Ge evaporated portion 8, most of Ge contained before the heat treatment has been evaporated, and thus almost no Ge is contained. However, when conditions for heat treatment are changed and only part of Ge contained in the Ge evaporated portion 8 before the heat treatment is evaporated, Ge may be contained in the Ge evaporated portion 8 at a lower content than that in the part of the SiGe layer 3 other than the Ge evaporated portion 8.

When the heat treatment described above is performed at a temperature ranging from 700° C. to 1050° C., Ge can be evaporated without causing any inconvenience due to degeneration of the SiGe layer 3. In this case, if heat treatment is performed at a high temperature, time required for the heat treatment is reduced. On the other hand, if heat treatment is performed at a low temperature, the SiGe layer 3 can be kept more stable during the heat treatment. In view of these points, the temperature range of heat treatment S is preferably from 700° C. to 950° C., and more preferably from 750° C. to 850° C.

Time for heat treatment is preferably 120 minutes at a temperature of 700° C., 90 minutes at a temperature of 750° C., 30 minutes at a temperature of 850° C., and 5 seconds at a temperature of 1050° C. When heat treatment is performed at some other temperature, time for heat treatment is set at time according to the temperature.

Heat treatment for evaporating Ge is performed under a vacuum of 133 Pa or less, or a non-oxygen atmosphere. When heat treatment is performed under a vacuum, Ge is evaporated more effectively with decreasing pressure. On the other hand, when heat treatment is performed in a non-oxygen atmosphere, pressure is maintained normal or reduced. In the latter case, there is no need to keep a vacuum state and thus costs can be advantageously reduced. Note that a non-oxygen atmosphere specifically means herein an atmosphere which contains an inert gas, nitrogen, or the like.

Figure 2A:
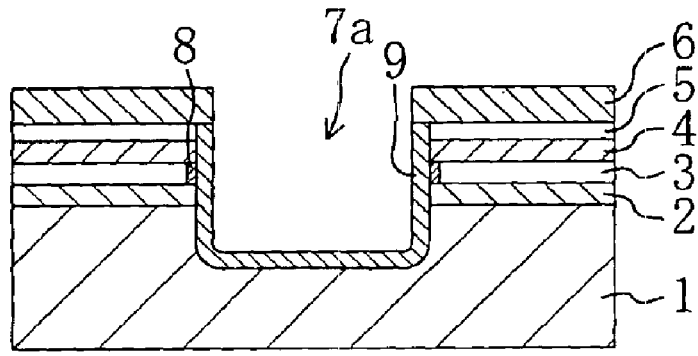
FIGS. 2A through 2C are cross-sectional views illustrating respective process steps up to the process step of forming a trench isolation in the method for fabricating the p-MOSFET including a SiGe layer according to the first embodiment.

Next, as shown in FIG. 2A, the surface portion of the trench 7a is thermally oxidized at 750° C., thereby forming a trench surface coating film (thermal oxide film) 9 so as to coat the surface of the trench 7a. In this case, part of the Ge evaporated portion 8 having a low Ge content is oxidized to become part of the trench surface coating film 9 in the SiGe layer 3. Thus, the amount of Ge segregation can be reduced, compared to the known method, and therefore interface states at the interface between the trench surface coating film 9 and the SiGe layer 3 can be reduced. At this time, part of the Ge evaporated portion 8 located close to the trench 7a is oxidized to be part of the trench surface coating film 9. Optionally, almost entire part of the Ge evaporated portion 8 and part of the SiGe layer 3 located close to the Ge evaporated portion 8 may be oxidized to be part of the trench surface coating film 9. This is because even in such a case, the amount of Ge segregation can be reduced to a lower level than that in the known method. Moreover, the trench surface coating film 9 has preferably a thickness of 30 nm or less, i.e., a thickness that does not affect device operation.

Figure 2B:
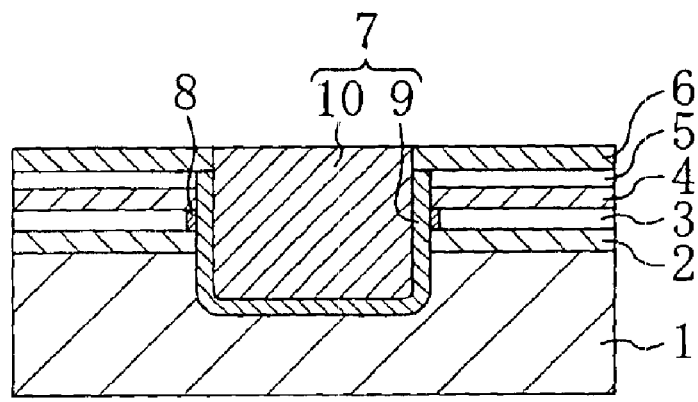

Next, in the process step shown in FIG. 2B, an oxide film for filling the trench 7a is formed on the substrate and then part of the oxide film located in the active layer forming region Rac is removed by etch-back or CMP (chemical mechanical polish). Thus, a trench oxide layer (insulator) 10 is formed to fill the trench 7a. In this manner, the active layer forming regions Rac in the semiconductor substrate is isolated from each other with the trench isolation 7 including the trench oxide layer 10 and the trench surface coating film 9 coating the trench oxide layer 10.

Figure 2C:
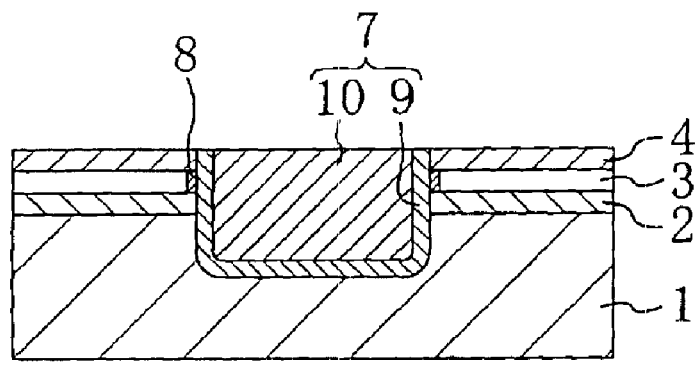

Next, in the process step shown in FIG. 2C, parts of the silicon nitride film 6 and the silicon oxide film 5 located in the active layer forming region Rac are removed by etching so that part of the Si cap layer 4 located in the active layer forming region Rac is exposed.

Figure 3A:
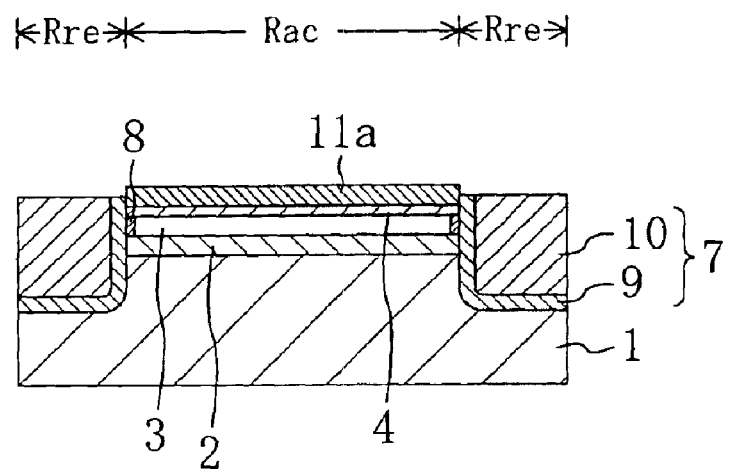
FIGS. 3A and 3B are cross-sectional views illustrating respective process steps subsequent to the process step of forming the trench isolation in a method for fabricating a semiconductor device according to the first embodiment.
Figure 3B:
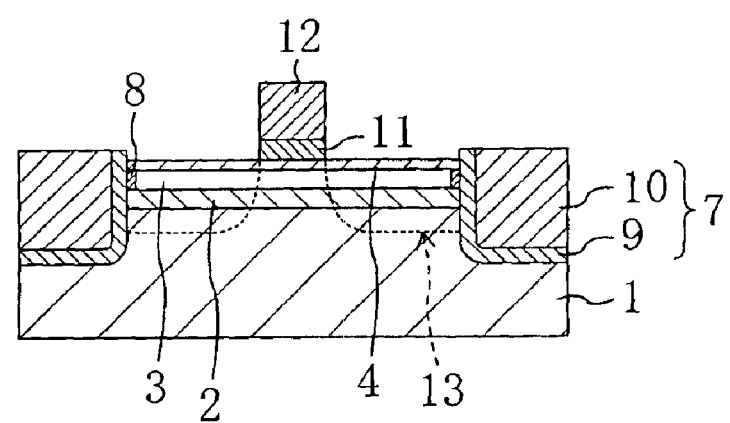
Figure 4A:
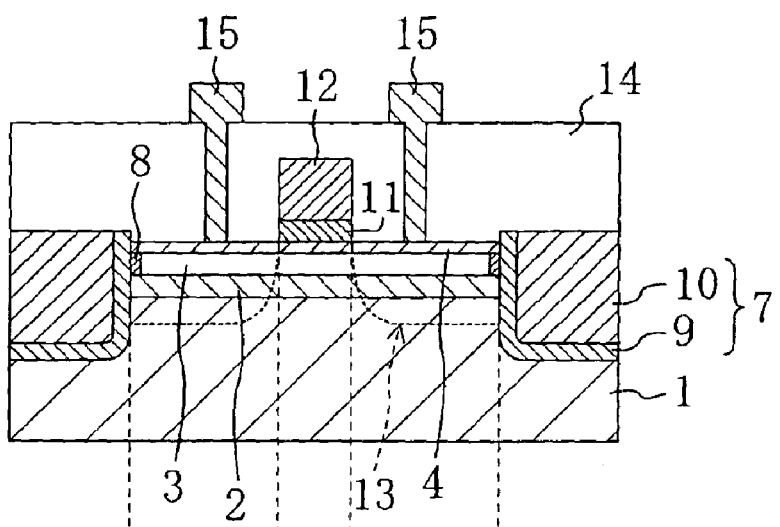
FIGS. 4A and 4B are cross-sectional and plane views illustrating a structure of the semiconductor device according to the first embodiment.
Figure 4B:
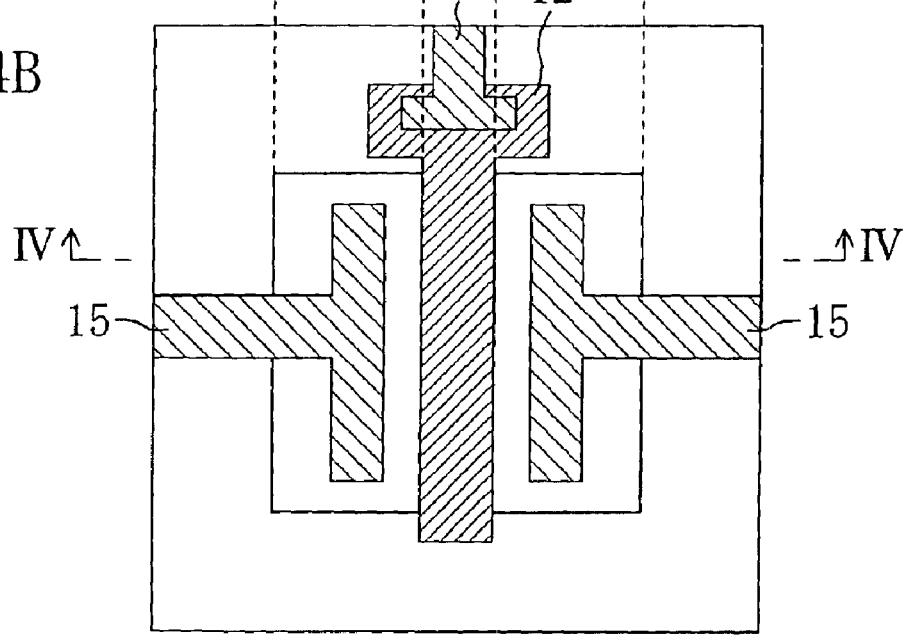

Next, process steps subsequent to the process step of forming a trench isolation in a method for fabricating a semiconductor device according to this embodiment will be described with reference to FIGS. 3A, 3B, 4A and 4B. FIGS. 3A and 3B are cross-sectional views illustrating respective process steps subsequent to the process step of forming a trench isolation in the method for fabricating a semiconductor device according to this embodiment. FIGS. 4A and 4B are cross-sectional and plane views illustrating the structure of the semiconductor device of this embodiment. Note that FIG. 4A is a cross-sectional view taken along the line IV—IV shown in FIG. 4B.

First, in the process step shown in FIG. 3A, an upper portion of the exposed part of the Si cap layer 4 located in the active layer forming region Rac is thermally oxidized at 750° C., thereby forming a thermal oxide film 11a having a thickness of 8 nm.

Next, in the process step shown in FIG. 3B, a polycrystalline silicon layer having a thickness of about 200 nm is deposited on the thermal oxide film 11a, and then B (boron) is ion-implanted into the polycrystalline silicon layer. Thereafter, the polycrystalline silicon layer and the thermal oxide film 11a are patterned to form a gate electrode 12 and a gate oxide film 11. Then, B (boron) is ion-implanted into the substrate using as a mask the gate electrode 12 and the gate oxide film 11, thereby forming source/drain regions 13.

Thereafter, the following process steps will be performed to obtain the structure shown in FIGS. 4A and 4B. An interlevel insulating film 14 formed of silicon oxide and having a thickness of 500 nm is formed. Then, heat treatment is performed to activate impurities or the like in the source/drain regions 13. Next, contact holes are formed through the interlevel insulating film 14 so as to reach the corresponding one of the source/drain regions 13. Thereafter, each of the contact hole is filled up to form an Al interconnect 15, so that the Al interconnect 15 extends onto part of the interlevel insulating film. In the process steps described above, the semiconductor device of this embodiment can be obtained.

Figure 5A:
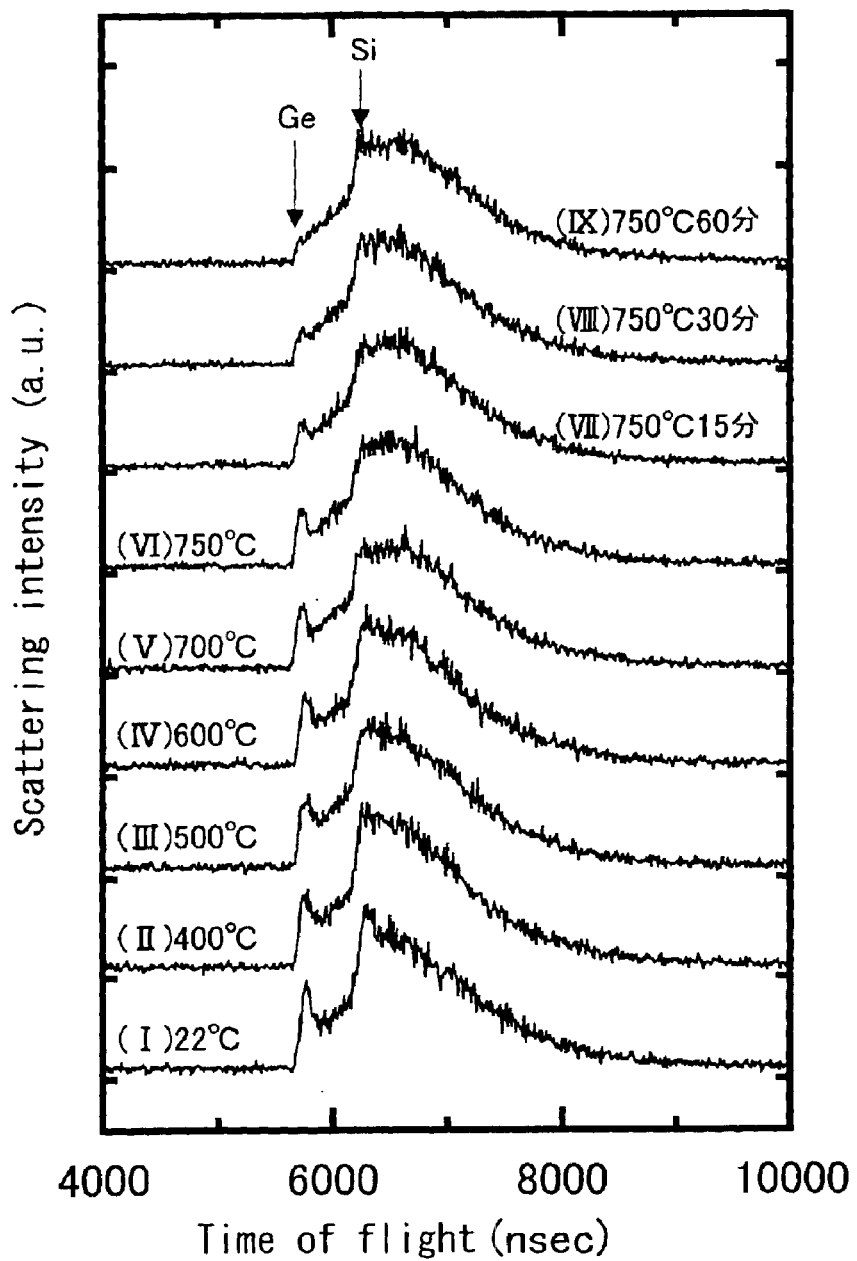
FIG. 5A is a graph showing results obtained by measuring using a low-speed ion scattering method the Ge content at the surface of a SiGe layer which has been subjected to heat treatment.
Figure 5B:
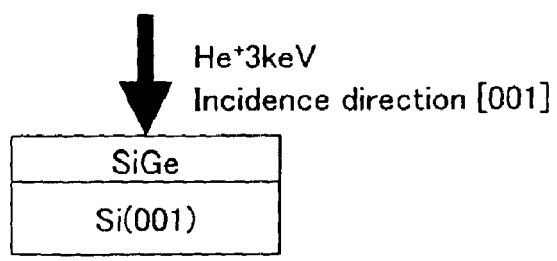
FIG. 5B is a cross-sectional view illustrating the measurement method.

Now, Ge evaporation caused by the heat treatment described above will be described with reference to FIGS. 5A and 5B. FIG. 5A is a graph showing results obtained by measuring using a low-speed ion scattering method the Ge content at the surface of a SiGe layer which has been subjected to heat treatment. FIG. 5B is a cross-sectional view illustrating the measurement method.

The measurement method using a low-speed ion scattering will be described. First, a SiGe layer having a 15% Ge content is grown on an Si substrate of the (001) plane orientation by UHV-CVD. Then, this substrate is introduced into a low-speed ion scattering analysis apparatus including a substrate heating system. With the substrate kept at a certain temperature for measurement, the surface of the substrate is bombarded with helium ions and then the time of flight of scattering helium ions is measured. Assume that the rates of heating and cooling the substrate are set at 20° C./min and the temperature range for measurement is set at a range from room temperature to 750° C. The substrate is bombarded with helium ions at 3 keV.

In FIG. 5A, each of spectra (I) through (IX) indicates the spectrum of the flight time (TOF spectrum) of helium ions at each measurement temperature. As shown in FIG. 5B, when the surface of the substrate is bombarded with helium ions ($He^+$), helium ions are collided with surface atoms (mass M). Some of the collided helium ions (mass m) are scattered at 180 degree to the incident direction. In this case, the flight time taken for helium ions to reach a detector after an impact of the helium ions to the surface atoms is proportional to $(M+m)/(M-m)$. Accordingly, by measuring spectra of flight times (TOF spectra), an element contained in the surface of the substrate can be specified.

As shown in FIG. 5A, TOF spectrum (I) for the substrate at room temperature (before subjected to heat treatment) has peaks at around 6400 nsec and 5800 nsec representing the Ge and Si contents in the substrate, respectively. Spectra (II) through (IV) also have peaks representing the Si and Ge contents in the substrate in the same manner as the spectrum (I). But, as for spectra (V) and (VI), the respective intensities of peaks representing the Ge content of the substrate gradually decrease. This indicates that Ge evaporation has started to be observed at around 700° C. Furthermore, as for spectra (VII) through (IX), the intensity of the peak representing the Ge content of the substrate decreases as well. But the spectrum (IX) has almost no peak From FIG. 5A, it can be understood that a large portion of Ge having existed around the surface of the SiGe layer are evaporated by performing heat treatment on the substrate at 750° C. for 60 minutes.

The results described above shows that: when the substrate is heated to 700° C. or more, Ge evaporation around the surface of the SiGe layer occurs; and when time for heat treatment is increased, the amount of evaporated Ge is increased. Therefore, it is sufficient that the heat treatment for Ge evaporation is performed at 700° C. or more. And time for heat treatment may be changed according to the temperature at which heat treatment is performed.

It has been also confirmed by the Ge content profiles of the SiGe layer in the inward direction that Ge is evaporated limitedly in a portion of the SiGe layer extending inward from the surface thereof by a distance of about 15 nm and the composition of SiGe is not changed in a further inward portion of the SiGe layer. Therefore, if an oxide film having a thickness of 30 nm or less is formed by oxidizing a portion of the SiGe layer located more inward than the portion extending inward from the surface thereof by a distance of about 15 nm, effects of the present invention can be fully achieved.

Hereinafter, effects of this embodiment will be described.

First, after the Ge evaporation potion 8 has been formed by evaporating Ge in the part of the SiGe layer 3 exposed to the trench 7a in the process step shown in FIG. 1C, part of the trench surface coating film 9 is formed by oxidizing part of the Ge evaporated portion 8 in the process step shown in FIG. 2A. Thus, in the process step shown in FIG. 2A, $SiO_2$ as good as one obtained by oxidizing Si can be obtained by oxidizing the Ge evaporated portion 8 with a low Ge content.

In addition, the Ge evaporated portion 8 of the SiGe layer 3 having a lower Ge content than that in the rest of the SiGe layer 3 is oxidized in this embodiment, and thus the amount of Ge segregation can be reduced. Therefore, a portion with a high Ge content is hardly formed around the interface between the SiGe layer 3 and the trench surface coating film 9. As a result, a reduced number of interface states are generated. More specifically, the density of interface states generated between the SiGe layer 3 and the trench surface coating film 9 is $10^9$–$10^{11}$ $cm^{-2}$, which is the almost same value as that for the density of interface states generated at the interface between $SiO_2$ formed by oxidizing an Si layer and Si. As has been described, the segregation of Ge and the generation of interface states can be suppressed. Thus, it is possible to suppress the occurrence of leakage current in part of the interface between the SiGe layer 3 and the trench surface coating film 9 located under the gate electrode 12. Accordingly, threshold voltage hardly fluctuates in a device.

Figure 6:
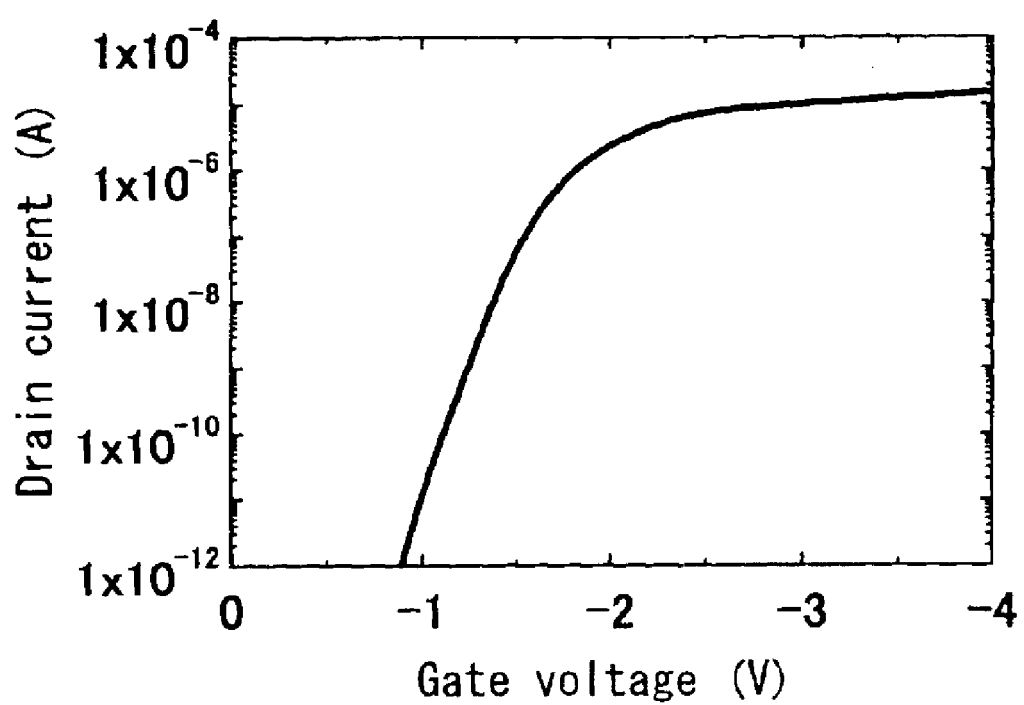
FIG. 6 is a graph showing drain current-gate voltage characteristics for the SiGe p-MOSFET shown in FIGS. 4A and 4B.

FIG. 6 is a graph showing drain current-gate voltage characteristics for the SiGe p-MOSFET shown in FIGS. 4A and 4B. Data shown in the graph of FIG. 6 was obtained under the condition where both of the gate length and the gate width of the SiGe p-MOSFET were 50 ì m and a source-drain voltage of –300 mV was applied. In FIG. 6, there is no hump on the curve representing subthreshold characteristics of threshold voltage in the semiconductor device according to this embodiment. This shows that drain current in the OFF state is also sufficiently suppressed.

Although the semiconductor device in which a SiGe layer is used has been described as an example in this embodiment, the present invention is applicable to a semiconductor device including a layer containing Si and Ge. Thus, a SiGeC layer may be used instead of a SiGe layer. As for the composition of SiGeC layers, for example, Ge content is 15% and C content is 1%.

Moreover, this embodiment is applicable to a semiconductor device including a SiGe layer or a SiGeC layer formed on an SOI substrate.

(Second Embodiment)

In this embodiment, a modified example of the method for fabricating a semiconductor device according to the first embodiment will be described. Hereinafter, description will be made using a semiconductor device including a SiGeC layer as an example.

Process steps up to the process step of forming a gate insulating film in a method for fabricating a semiconductor device according to this embodiment will be described with reference to FIGS. 7A through 7C, FIGS. 8A through 8C and FIGS. 9A and 9B. FIGS. 7A through 7C, FIGS. 8A through 8C and FIGS. 9A and 9B are cross-sectional views illustrating respective process steps up to the process step of forming a gate insulating film in the method for fabricating a p-MOSFET including a SiGeC layer according to this embodiment.

Figure 7A:
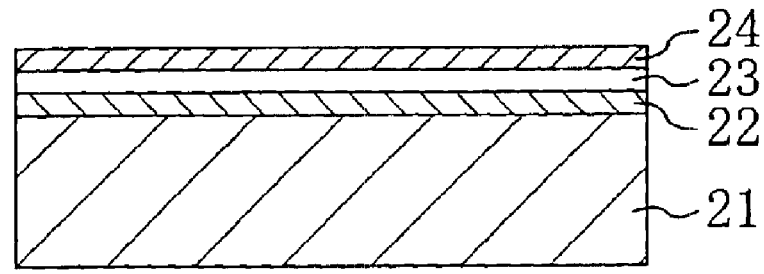
FIGS. 7A through 7C are cross-sectional views illustrating respective process steps up to the process step of performing heat treatment in a method for fabricating a p-MOSFET including a SiGeC layer according to a second embodiment of the present invention.

First, in the process step shown in FIG. 7A, an Si buffer layer 22 having a thickness of 10 nm, a SiGeC layer 23 having a thickness of 15 nm, a 25% Ge content and a 0.7% C content are epitaxially grown by UHV-CVD on an Si substrate 21 containing an n-type impurity at a concentration of $1\times10^{18}$ $cm^{-3}$. The UHV-CVD is performed using $Si_2H_6$ (disilane), $GeH_4$ (germane) and $SiH_3CH_3$ as source gases of Si, Ge and C, respectively. In this case, the growth temperature is 500° C. and no intentional doping is performed. Note that the semiconductor substrate is divided into an active layer forming region Rac and an isolation region Rre for convenience of description.

Thereafter, a deposited oxide film 24 is formed on the SiGeC layer 23 by CVD.

Figure 7B:
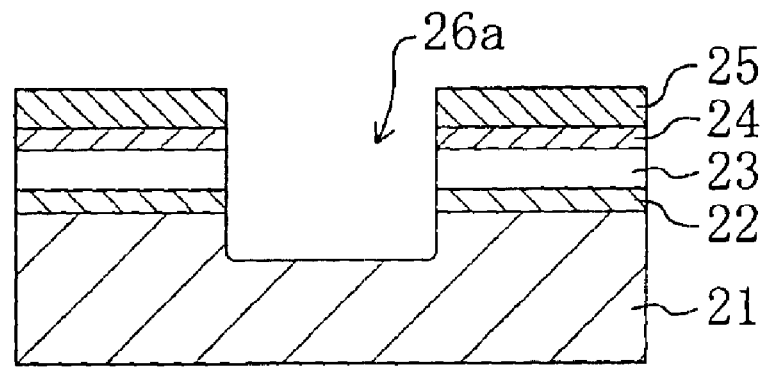

Next, in the process step shown in FIG. 7B, a silicon nitride film 25 having a thickness of 210 nm is formed on the deposited oxide film 24. Then, parts of the silicon nitride film 25 and the deposited oxide film 24 located in the isolation region Rre are removed. Using as a mask the remaining parts of the silicon nitride film 25 and the deposited oxide film 24 located in the active layer forming region Rac, the SiGeC layer 23, the Si buffer layer 22 and an upper portion of the Si substrate 21 are patterned, thereby forming a trench 26a with a depth of about 0.4 ì m to 0.8 ì m.

Figure 7C:
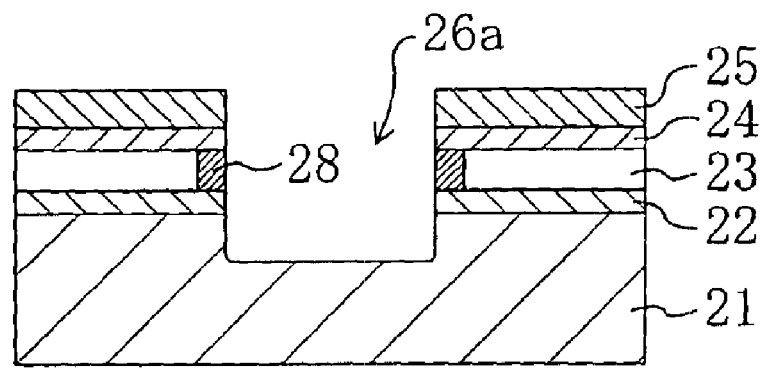

Next, in the process step shown in FIG. 7C, the surface of the substrate is subjected to heat treament at 750° C. for 60 minutes under a vacuum of $2.66\times10^{-7}$ Pa. With the heat treatment, Ge is evaporated in part of a surface portion of the trench 26a at which the SiGeC layer 23 is exposed, thereby forming a Ge evaporated portion 28 in a portion of the S SiGeC layer 23 which extends inward from the surface thereof exposed to the trench 26a by a distance of about 15 nm.

The width of the Ge evaporated portion 28 extending inward from its surface is preferably as small as a width that does not affect device operation. Therefore, if the width of the Ge evaporated portion 28 extending inward from its surface is 30 nm or less, reduction in the Ge content in part of an active region in a device or other inconveniences can be avoided.

In the Ge evaporated portion 28, most of Ge contained before the heat treatment has been evaporated, and thus almost no Ge is contained. However, when conditions for heat treatment are changed and only part of Ge that has been contained in the Ge evaporated portion 28 before the heat treatment is evaporated, Ge may be contained in the Ge evaporated portion 28 at a lower content than that in the part of the SiGeC layer 23 other than the Ge evaporated portion 28.

When the heat treatment described above is performed at a temperature ranging from 700° C. to 1050° C., Ge can be evaporated without causing any inconvenience due to degeneration of the SiGeC layer 23. In this case, if heat treatment is performed at a high temperature, time required for the heat treatment is reduced. On the other hand, if heat treatment is performed at a low temperature, the SiGeC layer 23 can be kept more stable during the heat treatment. In view of these points, the temperature range of heat treatment is preferably from 700° C. to 950° C., and more preferably from 750° C. to 850° C.

Time for heat treatment is preferably 120 minutes at a temperature of 700° C., 60 minutes at a temperature of 750° C., 30 minutes at a temperature of 850° C., and 5 seconds at a temperature of 1050° C. When heat treatment is performed at some other temperature, time for the heat treatment is set at time according to the temperature.

Heat treatment for evaporating Ge is performed under a vacuum of 133 Pa or less, or a non-oxygen atmosphere. When heat treatment is performed under a vacuum, Ge is evaporated more effectively with decreasing pressure. On the other hand, when heat treatment is performed in a non-oxygen atmosphere, pressure is maintained normal or reduced. In the latter case, there is no need to keep a vacuum state and thus costs can be advantageously reduced. Note that a non-oxygen atmosphere specifically means herein an atmosphere which contains an inert gas, nitrogen, or the like.

Figure 8A:
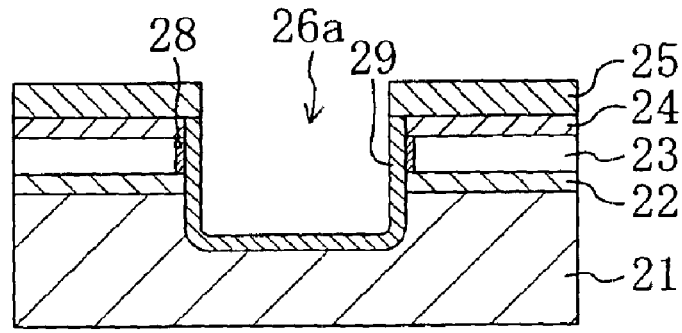
FIGS. 8A through 8C are cross-sectional views illustrating respective process steps up to the process step of forming a trench isolation in the method for fabricating the p-MOSFET including a SiGeC layer according to the second embodiment.

In the process step shown in FIG. 8A, the surface of the substrate is thermally oxidized at 750° C., thereby forming a thermal oxide film 29 on the surface of the trench 7a. In this case, the Ge evaporated portion 28 having a low Ge content is oxidized in the SiGeC layer 23. Thus, the amount of Ge segregation can be reduced, compared to the known method, and interface states at the interface between the SiGeC layer 23 and the thermal oxide film 29 can be reduced.

Figure 8B:
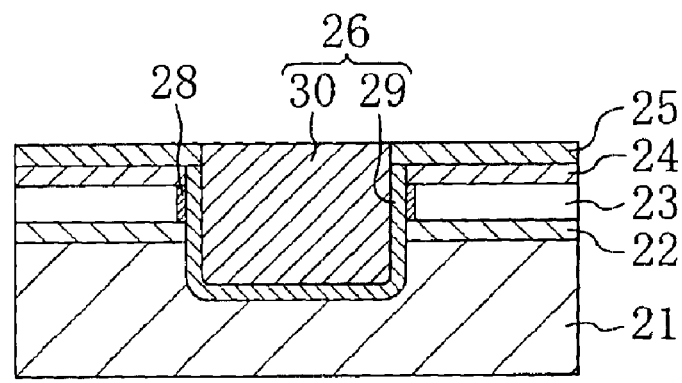

Next, in the process step shown in FIG. 8B, an oxide film for filling the trench 26a is formed on the substrate and then part of the oxide film located in the active layer forming region Rac is removed by etch-back or CMP (chemical mechanical polish). Thus, a trench oxide layer 30 is formed to fill the trench 26a. In this manner, the active layer forming regions Rac in the semiconductor substrate is isolated from each other with the trench isolation 26 including the trench oxide layer 30 and the trench surface coating film 29 coating the trench oxide layer 30.

Figure 8C:
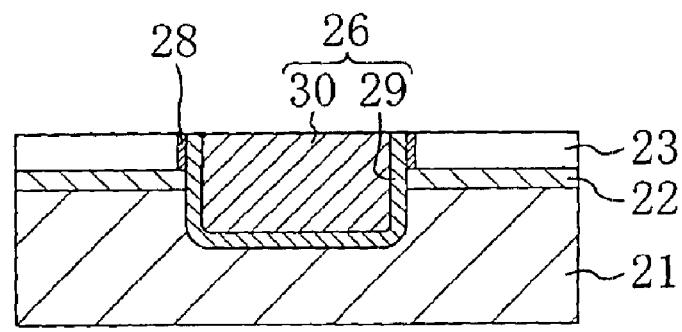

Next, in the process step shown in FIG. 8C, parts of the silicon nitride film 25 and the deposited oxide film 24 located in the active layer forming region Rac are removed by etching so that part of the SiGeC layer 23 located in the active layer forming region Rac is exposed.

Figure 9A:
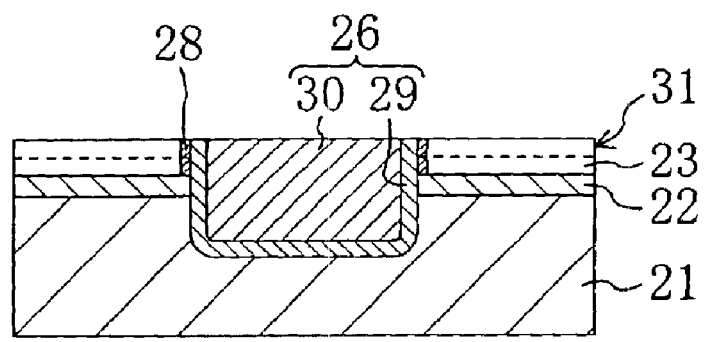
FIGS. 9A and 9B are cross-sectional views illustrating respective process steps up to the process step of forming a gate oxide film in the method for fabricating the p-MOSFET including a SiGeC layer according to the second embodiment.

Next, in the process step shown in FIG. 9A, the surface of the substrate is subjected to heat treatment at 750° C. for 60 minutes under a vacuum of $2.66 \times 10^{-7}$ Pa. With the heat treatment, Ge is evaporated in an upper portion of the SiGeC layer 23. Herein, the upper portion of the SiGeC layer 23 means a region of the substrate located in the vicinity of the surfaces of the trench but is not an active region. With the Ge evaporation, a Ge evaporated portion 31 is formed in part of the SiGeC layer 23 which extends downward from the surface thereof by a distance of about 15 nm.

In the SiGeC layer 23, the part other than the Ge evaporated portions 28 and 31 is the major portion having the same composition as that before the heat treatment. In the Ge evaporated portion 31, most of Ge contained before the heat treatment has been evaporated, and thus almost no Ge is contained. However, there may be cases where only part of Ge contained in the Ge evaporated portion 31 before the heat treatment is evaporated due to heat treatment condition change or the like. In such a case, Ge may be contained in the Ge evaporated portion 31 at a lower content than that in the part of the SiGeC layer 23 other than the Ge evaporated portion 31.

The conditions including temperature range, heating time, and atmosphere for the heat treatment in this process step are the same as those in the process step of FIG. 7C.

Figure 9B:
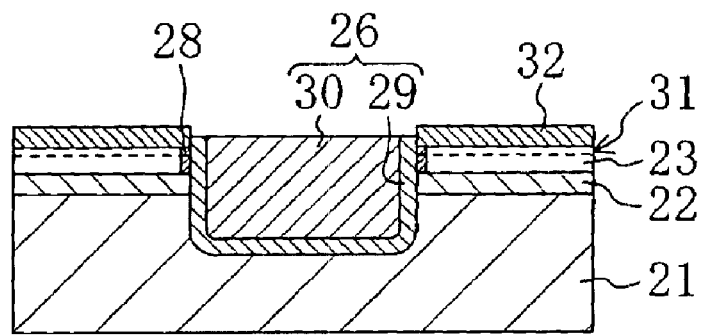
Figure 10A:
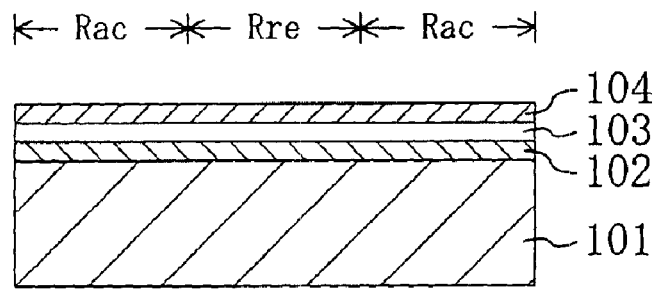
FIGS. 10A through 10E are cross-sectional views illustrating the process steps of forming a trench isolation in a substrate on which a SiGe layer has been formed in a known manner.
Figure 10B:
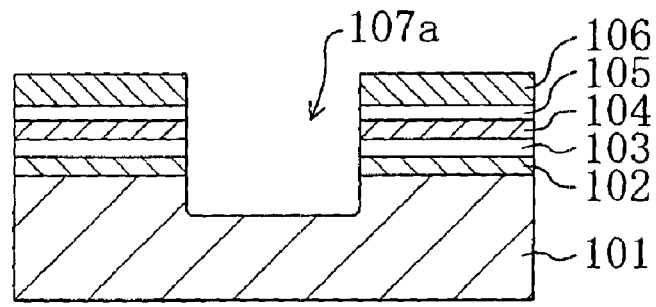
Figure 10C:
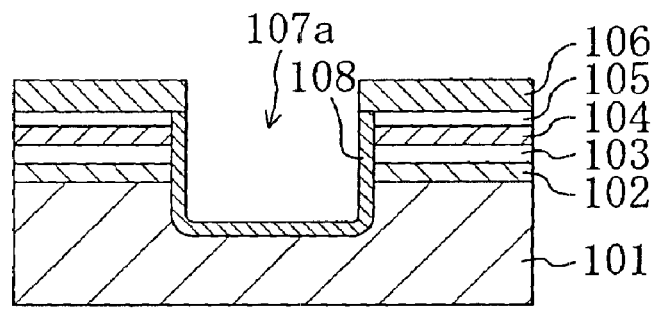
Figure 10D:
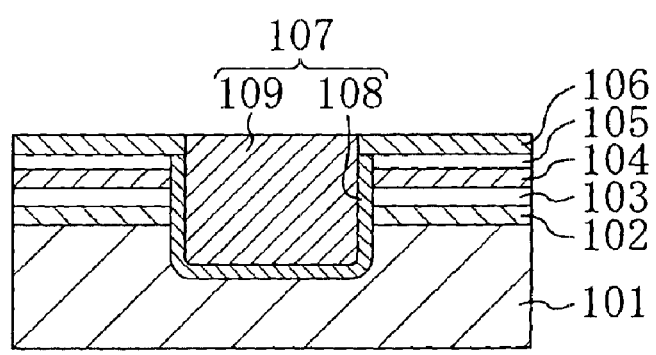
Figure 10E:
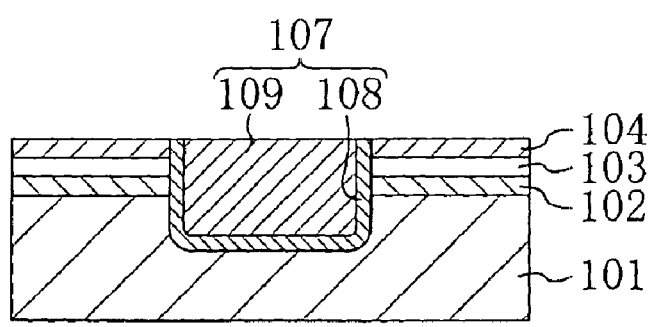
Figure 11A:
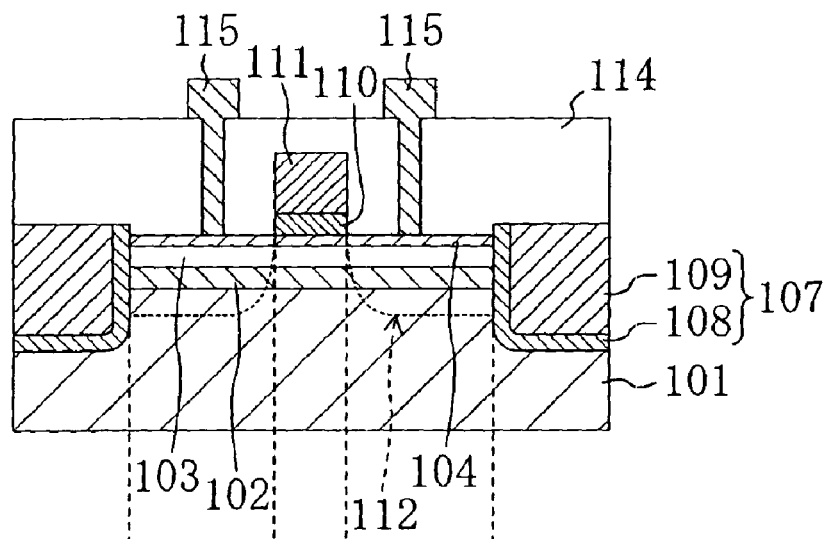
FIGS. 11A and 11B are cross-sectional and plane views illustrating a structure of a p-type MOSFET including a trench isolation formed in the known manner.
Figure 11B:
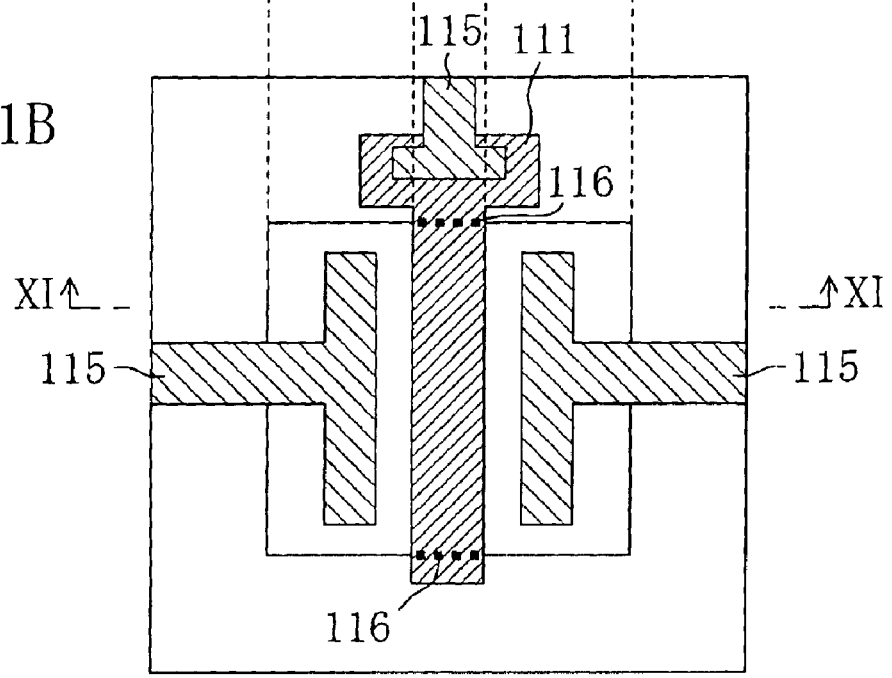
Figure 12:
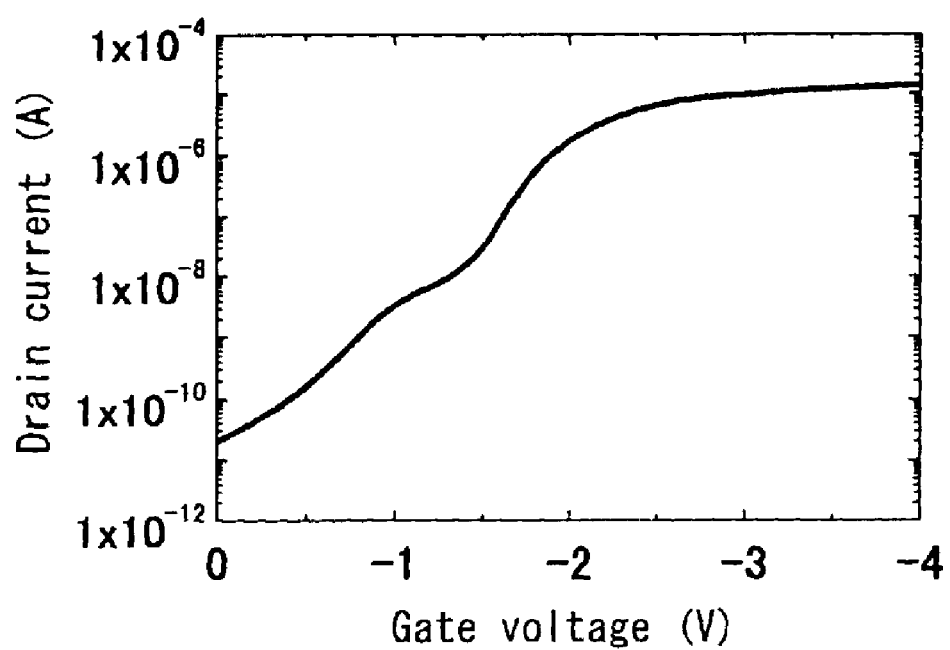
FIG. 12 is a graph showing drain current-gate voltage characteristics in the SiGe p-MOSFET shown in FIGS. 11A and 11B.

In the process step shown in FIG. 9B, the surface of the substrate is thermally oxidized at 750° C., thereby forming a gate oxide film 32 on the SiGeC layer 23. In this case, the Ge evaporated portion 31 having a low Ge content is oxidized and thus the amount of Ge segregation can be reduced. Therefore, interface states at the interface between the SiGeC layer 23 and the gate oxide film 32 can be reduced.

Subsequent process steps are the same as those of the first embodiment.

In this embodiment, the same effects as those of the first embodiment can be achieved. In addition to the effects, the following effects can be also attained.

In this embodiment, the gate oxide film 32 is formed by oxidizing the upper portion of the Ge evaporated portion 31. Thus, unlike the known method, there is no need to form a cap layer on the SiGeC layer. Therefore, the process steps can be simplified.

Note that in this embodiment, heat treatment for forming the Ge evaporated portion 31 may be performed in any process step between the process step of forming the SiGeC layer 23 and the process step of forming the gate oxide film 32. Thus, the same effects can be attained.

Moreover, this embodiment is also applicable to a p-MOSFET using a SiGe layer.

Moreover, this embodiment is also applicable to a semiconductor device including a SiGe layer or a SiGeC layer formed on an SOI substrate.

(Third Embodiment)

Figure 13A:
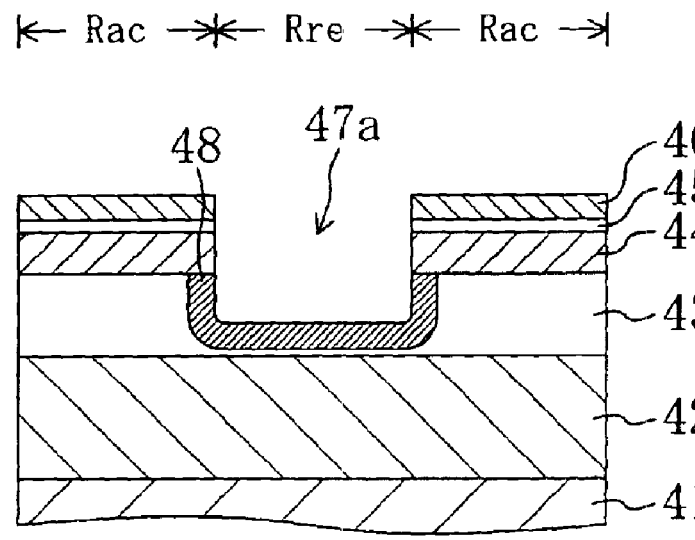
FIGS. 13A and 13B are cross-sectional views illustrating the process steps of performing heat treatment and thermal oxidation, respectively, for a surface portion of a trench in a method for fabricating a semiconductor device according to a third embodiment of the present invention.
Figure 13B:
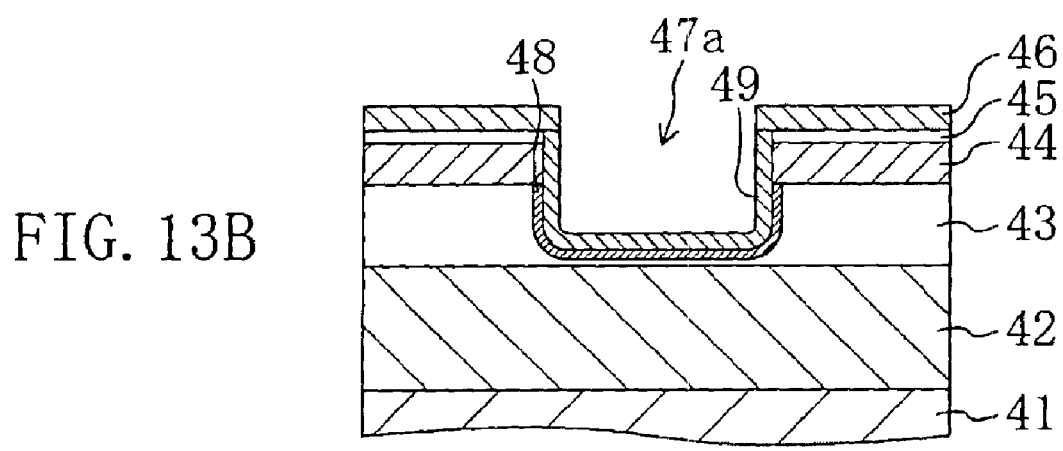

In this embodiment, a semiconductor device including a SiGe layer, an Si layer (strained Si layer) grown on the SiGe layer will be described with reference to FIGS. 13A and 13B. FIGS. 13A and 13B are cross-sectional views illustrating the process steps of performing heat treatment and thermal oxidation for a surface portion of a trench, respectively, in a method for fabricating a semiconductor device according to a third embodiment of the present invention.

To obtain such a substrate as one shown in FIG. 13A, the following process steps are performed. First, a semiconductor substrate including on a silicon substrate 41, a SiGe layer 42 having a 20–50% Ge content and a thickness of 2.5 ì m, a relaxed SiGe layer 43 having a 50% or more Ge content and a thickness of 500 nm, a strained Si layer 44 epitaxially grown on the relaxed SiGe layer 43 and having a thickness of 50 nm, a silicon oxide film 45 having a thickness of 15 nm, and a silicon nitride film 46 having a thickness of 210 nm is prepared.

Then, parts of the silicon nitride film 46, the silicon oxide film 45, the strained Si layer 44 and part of the upper portion of the relaxed SiGe layer 43 located in the isolation region Rre are removed by anisotropic dry etching to form a trench 47a through the silicon nitride film 46, the silicon oxide film 45, and the strained Si layer 44.

Next, in the process step shown in FIG. 13A, heat treatment is performed at 750° C. for 60 minutes under a vacuum of $2.66 \times 10^{-7}$ Pa. With the heat treatment, Ge is evaporated in part of the relaxed SiGe layer 43 located around part of the surface of the trench 47a at which part of the relaxed SiGe layer 43 is exposed. With the Ge evaporation, a Ge evaporated portion 48 is formed in part of the relaxed SiGe layer 43 extending inward from the surface thereof exposed to the trench 47a by a distance of about 15 nm. Here, in the relaxed SiGe layer 43 the part other than the Ge evaporated portion 48 is the major portion having the same composition as that before the heat treatment. In the Ge evaporated portion 48, most of Ge contained before the heat treatment has been evaporated, and thus almost no Ge is contained. However, there may be cases where only part of Ge contained in the Ge evaporated portion 48 before the heat treatment is evaporated due to heat treatment condition change or the like. In such a case, Ge may be contained in the Ge evaporated portion 48 at a lower content than that in the part of the relaxed SiGe layer 43 other than the Ge evaporated portion 48.

When the heat treatment described above is performed at a temperature ranging from 700° C. to 1050° C., Ge can be evaporated without causing any inconvenience due to degeneration of the strained Si layer 44 or the like. In this case, if heat treatment is performed at a high temperature, time required for the heat treatment is reduced. On the other hand, if heat treatment is performed at a low temperature, the strained Si layer 44 can be kept more stable during the heat treatment. In view of these points, the temperature range of heat treatment is preferably from 700° C. to 950° C., and more preferably from 750° C. to 850° C.

Time for heat treatment is preferably 120 minutes at a temperature of 700° C., 90 minutes at a temperature of 750° C., 30 minutes at a temperature of 850° C., and 5 seconds at a temperature of 1050° C. When heat treatment is performed at some other temperature, time for the heat treatment is set at time according to the temperature.

Heat treatment for evaporating Ge is performed under a vacuum of 133 Pa or less, or a non-oxygen atmosphere. When heat treatment is performed under a vacuum, Ge is evaporated more effectively with decreasing pressure. On the other hand, when heat treatment is performed in a non-oxygen atmosphere, pressure is maintained normal or reduced. In the latter case, there is no need to keep a vacuum state and thus costs can be advantageously reduced. Note that a non-oxygen atmosphere specifically means herein an atmosphere which contains an inert gas, nitrogen, or the like.

Next, in the process step shown in FIG. 13B, a surface portion of the trench 47a is thermally oxidized, thereby forming a trench surface coating film 49 so as to coat the surface of the trench 47a. In this case, part of the Ge evaporated portion 48 having a low Ge content is oxidized to become part of the trench surface coating film 49 in the relaxed SiGe layer 43, and thus the amount of Ge segregation can be reduced compared to the known method. Thus, interface states at the interface between the trench surface coating film 49 and the relaxed SiGe layer 43 can be reduced. At this time, part of the Ge evaporated portion 48 located close to the surface of the trench 47a is oxidized to be part of the trench surface coating film 49. Optionally, the almost entire part of the Ge evaporated portion 48 and part of the relaxed SiGe layer 43 located close to the Ge evaporated portion 48 may be oxidized to be part of the trench surface coating film 49. This is because even in such a case, the amount of Ge segregation can be reduced to a lower level than that in the known method.

Thereafter, the trench 47a is filled with a silicon oxide film to form a trench isolation. Furthermore, a device such as an MISFET is formed in part of the substrate located in the active layer forming region Rae. The process step of forming a trench isolation and then forming a device is the same as that of the first embodiment. Therefore, description of the process step will be omitted.

In this embodiment, instead of the substrate described above, a substrate with the layer structure including a strained Si layer that has been disclosed in U.S. Pat. No. 5,534,713 (Japanese Patent Publication No. 2994227) may be formed. U.S. Pat. No. 5,534,713 is hereby incorporated by reference.

(Fourth Embodiment)

In this embodiment, a semiconductor device which includes a strained Si layer and has a different structure from that of the third embodiment will be described with reference to FIGS. 14A through 14D. FIGS. 14A through 14D are cross-sectional views illustrating respective process steps up to the process step of performing thermal oxidation for a surface portion of a trench in a method for fabricating a semiconductor device according to a fourth embodiment.

Figure 14A:
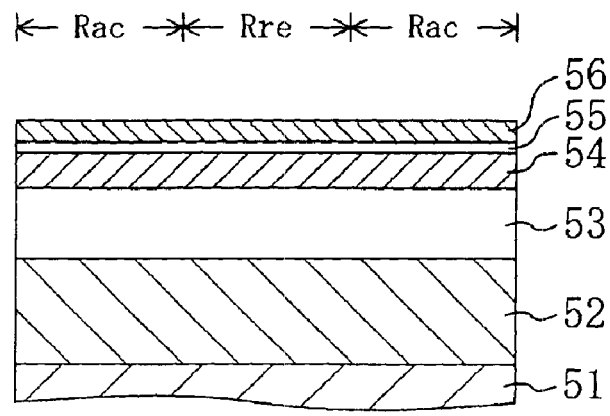
FIGS. 14A through 14D are cross-sectional views illustrating respective process steps up to the process step of performing thermal oxidation for a surface portion of a trench in a method for fabricating a semiconductor device according to a fourth embodiment.

First, in the process step shown in FIG. 14A, a SiGe layer (not shown) having a 30% Ge content and a thickness of 100 nm is bonded onto a substrate including a silicon substrate 51 and a silicon oxide layer 52. Thereafter, heat treatment is performed at 800° C. for one hour, so that the SiGe layer is relaxed to become a relaxed SiGe layer 53. Subsequently, an strained Si layer 54 having a thickness of 50 nm is epitaxially grown on the relaxed SiGe layer 53.

Then, an upper portion of the strained Si layer 54 is oxidized at 750° C., thereby forming a silicon oxide film 55 having a thickness of 15 nm. On the silicon oxide film 55, a silicon nitride film 56 having a thickness of 210 nm is formed at 740° C.

Figure 14B:
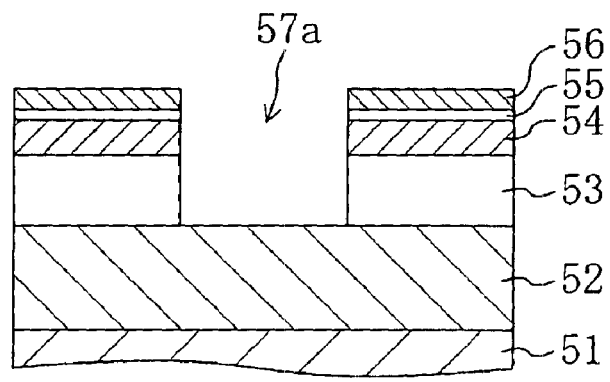

In the process step shown in FIG. 14B, a trench 57a is formed by anisotropic dry etching in part of the substrate located in an isolation region Rre so as to reach the silicon oxide layer 52 through the silicon nitride film 56, the silicon oxide film 55, the strained Si layer 54 and the relaxed SiGe layer 53.

Figure 14C:
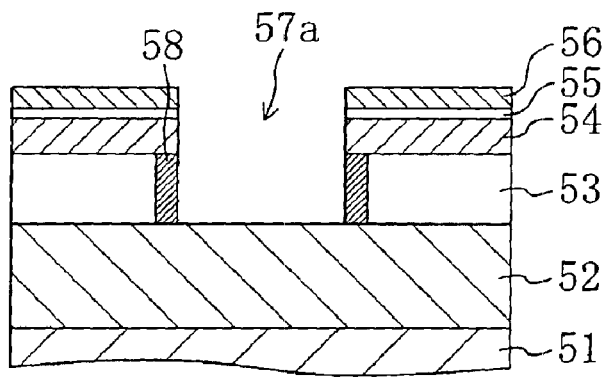

Next, in the process step shown in FIG. 14C, heat treatment is performed at 750° C. for 60 minutes under a vacuum of $2.66 \times 10^{-7}$ Pa. With the heat treatment, Ge is evaporated around part of the surface of the trench 57a at which the relaxed SiGe layer 53 is exposed. With the Ge evaporation, a Ge evaporated portion 58 is formed in part of the relaxed SiGe layer 53 extending inward from the surface thereof exposed to the trench 57a by a distance of about 15 nm. Here, in the relaxed SiGe layer 53, the part other than the Ge evaporated portion 58 is the major portion having the same composition as that before the heat treatment. In the Ge evaporated portion 58, most of Ge contained before the heat treatment has been evaporated, and thus almost no Ge is contained. However, there may be cases where only part of Ge contained in the Ge evaporated portion 58 before the heat treatment is evaporated due to heat treatment condition change or the like. In such a case, Ge may be contained in the Ge evaporated portion 58 at a lower content than that in part of the relaxed SiGe layer 53 other than the Ge evaporated portion 58.

When the heat treatment described above is performed at a temperature ranging from 700° C. to 1050° C., Ge can be evaporated without causing any inconvenience due to degeneration of the strained Si layer 54 or the like. In this case, if heat treatment is performed at a high temperature, time required for the heat treatment is reduced. On the other hand, if heat treatment is performed at a low temperature, the strained Si layer 54 can be kept more stable during the heat treatment. In view of these points, the temperature range of heat treatment is preferably from 700° C. to 950° C., and more preferably from 750° C. to 850° C.

Time for heat treatment is preferably 120 minutes at a temperature of 700° C., 90 minutes at a temperature of 750° C., 30 minutes at a temperature of 850° C., and 5 seconds at a temperature of 1050° C. When heat treatment is performed at some other temperature, time for the heat treatment is set at time according to the temperature.

Heat treatment for evaporating Ge is performed under a vacuum of 133 Pa or less, or a non-oxygen atmosphere. When heat treatment is performed under a vacuum, Ge is evaporated more effectively with decreasing pressure. On the other hand, when heat treatment is performed in a non-oxygen atmosphere, pressure is maintained normal or reduced. In the latter case, there is no need to keep a vacuum state and thus costs can be advantageously reduced. Note that a non-oxygen atmosphere specifically means herein an atmosphere which contains an inert gas, nitrogen, or the like.

Figure 14D:
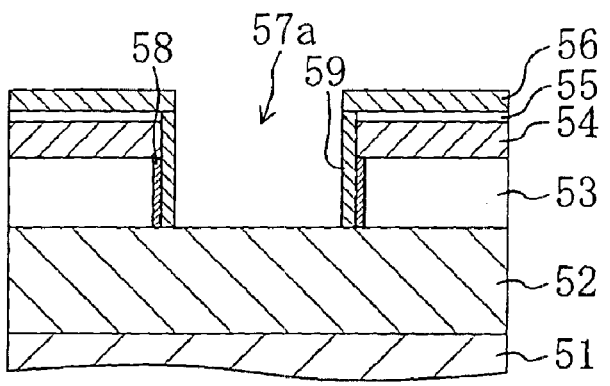

Next, in the process step shown in FIG. 14D, a surface portion of the trench 57a is thermally oxidized at 750° C., thereby forming a trench surface coating film 59 so as to coat the surface of the trench 57a. In this case, part of the Ge evaporated portion 58 having a low Ge content is oxidized to become part of the trench surface coating film 59 in the relaxed SiGe layer 53, and thus the amount of Ge segregation can be reduced, compared to the known method. Thus, interface states at the interface between the trench surface coating film 59 and the relaxed SiGe layer 53 can be reduced. At this time, part of the Ge evaporated portion 58 located close to the surface of the trench 57a is oxidized to be part of the trench surface coating film 59. Optionally, the almost entire part of the Ge evaporated portion 58 and part of the relaxed SiGe layer 53 located close to the Ge evaporated portion 58 may be oxidized to be part of the trench surface coating film 59. This is because even in such a case, the amount of Ge segregation can be reduced to a lower level than that in the known method.

Thereafter, the trench 57a is filled with a silicon oxide film to form a trench isolation. Furthermore, a device such as an MISFET is formed in part of the substrate located in the active layer forming region Rac. The process steps of filling a trench to form a trench isolation and then forming a device are the same as those of the first embodiment. Therefore, descriptions of the process steps will be omitted.

Figure 15:
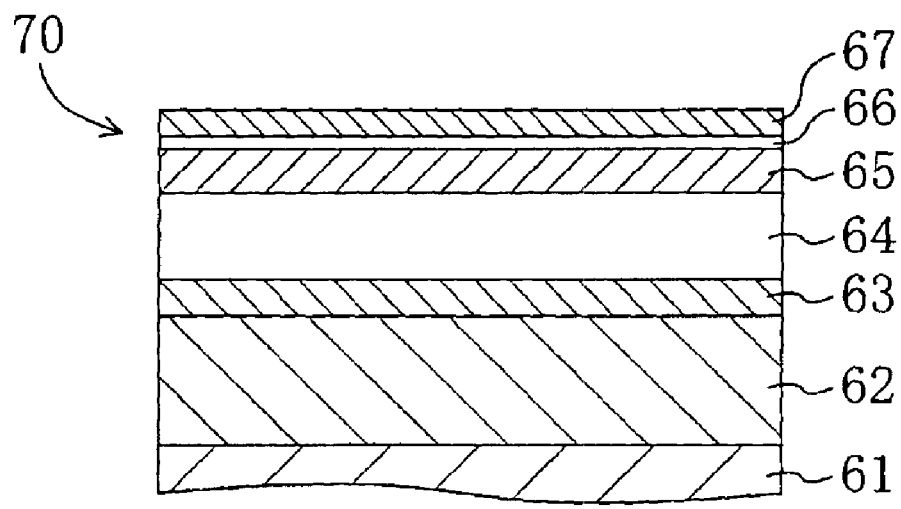
FIG. 15 is a cross-sectional view illustrating an exemplary substrate used in the fourth embodiment.

In this embodiment, the substrate in which a SiGe layer is bonded onto the silicon oxide film 52 is used. However, a substrate in which an Si layer is interposed between the silicon oxide film 52 and the SiGe layer may be used in the present invention. The structure of such a substrate will be described with reference to FIG. 15. FIG. 15 is a cross-sectional view illustrating an exemplary structure for a substrate used in the fourth embodiment.

As shown in FIG. 15, a substrate 70 includes a silicon substrate 61, a silicon oxide layer 62, an Si layer 63, a relaxed SiGe layer 64, a strained Si layer 65, a silicon oxide film 66, and a silicon nitride film 67. The Si layer 63 is formed on the silicon oxide layer 62 and has a thickness of 50 nm. On the Si layer 63, the relaxed SiGe layer 64 having a 30% Ge content and a thickness of 100 nm, the strained Si layer 65 having a thickness of 50 nm, the silicon oxide film 66 having a thickness of 15 nm, and the silicon nitride film 67 having a thickness of 210 nm are formed.

As the process step of forming a substrate 70, a SiGe layer (not shown) having a 30% Ge content is formed on an SOI substrate including a silicon substrate 61, a silicon oxide layer 62 and an Si layer 63. Then, by performing the same heat treatment as that shown in FIG. 14A, the SiGe layer is relaxed to form a relaxed SiGe layer 64. Other process steps are the same as those described in FIG. 14A.

Figure 16:
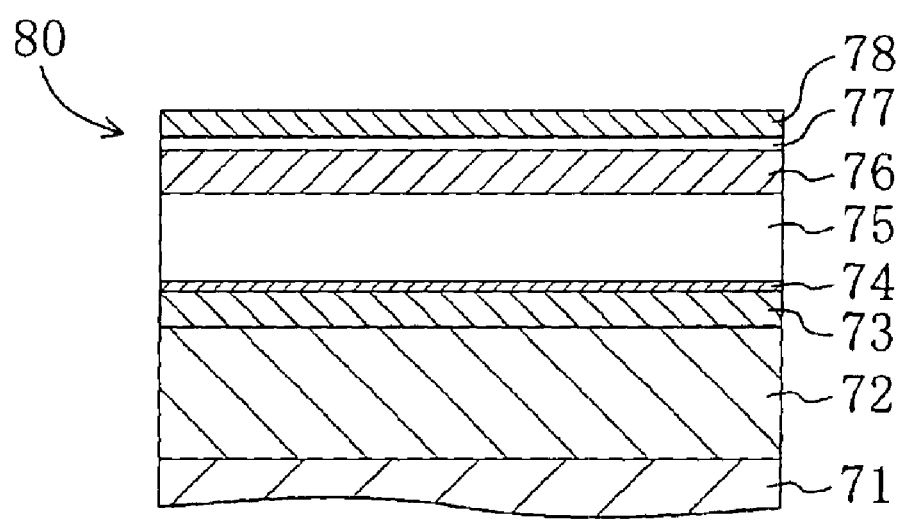
FIG. 16 is a cross-sectional view illustrating another exemplary substrate used in the fourth embodiment.

Also, an Si layer and a Ge layer may be interposed between the silicon oxide film 52 and the SiGe layer 53 shown in FIG. 14A. This structure will be described with reference to FIG. 16. FIG. 16 is a cross-sectional view illustrating another exemplary structure for a substrate used in the fourth embodiment.

As shown in FIG. 16, a substrate 80 includes a silicon substrate 71, a silicon oxide layer 72, an Si layer 73, a Ge layer 74, a relaxed SiGe layer 75, a strained Si layer 76, a silicon oxide film 77, and a silicon nitride film 78. The Si layer 73 is formed on the silicon oxide layer 72 and has a thickness of 50 nm. The Ge layer 74 is formed on the Si layer 73 and has a thickness of 1 nm. The relaxed SiGe layer 75 is formed on the Ge layer 74 and has a 30% Ge content and a thickness of 100 nm. The strained Si layer 76 has a thickness of 50 nm. The silicon oxide film 77 has a thickness of 15 nm. The silicon nitride film 78 has a thickness of 210 nm. In this structure, the Ge layer is provided and thus the dislocation density in the relaxed SiGe layer 75 can be reduced.

As the process step of forming a substrate 80, a SiGe layer (not shown) having a 30% Ge content is formed on an SOI substrate including a silicon substrate 71, a silicon oxide film 72 and an Si layer 73 with a Ge layer 74 interposed between the SiGe layer and the SOI substrate. Then, by performing the same heat treatment as that shown in FIG. 14A, the SiGe layer is relaxed to form a relaxed SiGe layer 75. Other process steps are the same as those described in FIG. 14A.

In this embodiment, the case in which an SOI substrate is formed by bonding has been described. However, such an SOI substrate as shown in FIGS. 14A, 15 and 16 may be formed by SIMOX.

Note that FIGS. 15 and 16 illustrates layer structures disclosed in Japanese Unexamined Patent Publication No. 9-180999.

(Other Embodiments)

In the foregoing embodiments, p-MOSFETs have been described as examples. However, an n-MOSFET may be used in the present invention.

Furthermore, the present invention is applicable to a heterojunction bipolar transistor including a SiGe layer or a SiGeC layer. In such a case, Ge can be also evaporated.

In the foregoing embodiments, semiconductor devices in which a layer containing Si and Ge serves as a hole channel have been described as examples. However, the present invention is applicable to a semiconductor device including a layer containing Si and Ge not as a channel layer but as some other layer. In such a case, Ge can be evaporated by performing heat treatment in the process step of making the layer containing Si and Ge exposed.

Note that the present invention is not limited to use in the process step described in the foregoing embodiments but is applicable to use in pretreatment for the process step of oxidizing a SiGe layer or a SiGeC layer. In such a case, Ge can be also evaporated.

What is claimed is:

1. A method for fabricating a semiconductor device, comprising of the steps of:
   a) forming a compound semiconductor layer containing Si and Ge above a semiconductor substrate;
   b) removing part of the compound semiconductor layer to form a trench;
   c) performing heat treatment on a surface portion of the trench, and forming a Ge evaporated portion in part of the surface portion of the trench at which the compound semiconductor layer is exposed;
   d) oxidizing at least part of the surface portion of the trench to form a thermal oxide film; and
   e) filling the trench with an insulator to form a trench isolation including the thermal oxide film and the insulator.

2. The method of claim 1, wherein the step c), the heat treatment is performed under vacuum.

3. The method of claim 1, wherein the step c), the heat treatment is performed in a non-oxygen atmosphere.

4. The method of claim 1, further comprising after the step a), the step of epitaxially growing an Si layer on the compound semiconductor layer.

5. The method of claim 1, wherein the step a), the compound semiconductor layer is provided on the semiconductor substrate with an insulating layer interposed therebetween.

6. The method of claim 1, wherein the heat treatment is performed at a temperature ranging from 700° C. to 1050° C.

7. The method of claim 1, wherein the step d), part of the compound semiconductor layer extending inward from the surface thereof located at the trench to a distance of 30 nm or less.

8. The method of claim 1, wherein the step C), an upper portion of the compound semiconductor layer is subjected to heat treatment,
   wherein in the step d), the upper portion of the compound semiconductor layer is oxidized to form a gate oxide film, and
   wherein the method further includes after the step d), the step of forming a gate electrode.

* * * * *